United States Patent
Nakagawa et al.

(10) Patent No.: US 10,725,376 B2
(45) Date of Patent: Jul. 28, 2020

(54) PATTERN-FORMING METHOD

(71) Applicant: JSR CORPORATION, Tokyo (JP)

(72) Inventors: Hisashi Nakagawa, Tokyo (JP); Takehiko Naruoka, Tokyo (JP); Motohiro Shiratani, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/460,477

(22) Filed: Mar. 16, 2017

(65) Prior Publication Data

US 2017/0184961 A1 Jun. 29, 2017

Related U.S. Application Data

(63) Continuation of application No. PCT/JP2015/076203, filed on Sep. 15, 2015.

(30) Foreign Application Priority Data

Sep. 17, 2014 (JP) .................... 2014-189178

(51) Int. Cl.
| | | |
|---|---|---|
| G03F 7/30 | (2006.01) | |
| G03F 7/004 | (2006.01) | |
| G03F 7/32 | (2006.01) | |
| G03F 7/038 | (2006.01) | |
| G03F 7/16 | (2006.01) | |
| G03F 7/20 | (2006.01) | |

(52) U.S. Cl.
CPC .......... *G03F 7/0044* (2013.01); *G03F 7/0042* (2013.01); *G03F 7/0045* (2013.01); *G03F 7/038* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/325* (2013.01)

(58) Field of Classification Search
CPC ........ G03F 7/30; G03F 7/2004; G03F 7/2006; G03F 7/0044
USPC .................................. 430/323, 325
See application file for complete search history.

(56) References Cited

U.S. PATENT DOCUMENTS

| | | | | | |
|---|---|---|---|---|---|
| 5,061,599 A | * | 10/1991 | Kudo | ................... | G03F 7/0042 252/186.43 |
| 5,271,797 A | * | 12/1993 | Kamisawa | .............. | C23C 18/06 216/101 |
| 7,312,013 B2 | * | 12/2007 | Takahashi | ................ | C09K 3/10 430/270.1 |
| 8,026,038 B2 | * | 9/2011 | Ogihara | ................. | C08G 77/56 430/270.1 |
| 8,029,974 B2 | * | 10/2011 | Ogihara | .................... | G03F 7/11 430/270.1 |
| 8,647,809 B2 | * | 2/2014 | Sullivan | ................. | C08G 77/58 430/270.1 |
| 8,703,386 B2 | * | 4/2014 | Bass | ..................... | G03F 7/0042 430/270.1 |
| 2007/0099096 A1 | | 5/2007 | Sasaki et al. | | |
| 2012/0315451 A1 | * | 12/2012 | Malik | ....................... | C08F 4/06 428/209 |
| 2013/0224652 A1 | | 8/2013 | Bass et al. | | |
| 2015/0192851 A1 | * | 7/2015 | Yamashita | ............ | G03F 7/2002 430/282.1 |

FOREIGN PATENT DOCUMENTS

| | | |
|---|---|---|
| JP | H08-146610 A | 6/1996 |
| JP | H11-125907 A | 5/1999 |
| JP | 2000-298347 A | 10/2000 |
| JP | 2007-148371 A | 6/2007 |
| JP | 2014-122279 A | 7/2014 |
| JP | 2015-212329 A | 11/2015 |
| WO | WO 2013/128313 A1 | 9/2013 |

OTHER PUBLICATIONS

M. Kryask, et al., "Nanoparticle Photoresists: Ligand Exchange as a New and Sensitive EUV Patterning Mechanism", Journal of Photopolymer Science and Technology, vol. 26, Nov. 5, 2013. pp. 659-663.
International Search Report dated Dec. 15, 2015, in PCT/JP2015/076203 filed Sep. 15, 2015 (w/ English translation).
Japanese Office Action dated Jan. 15, 2019 in Patent Application No. 2016-548899 (with English translation), 8 pages.

* cited by examiner

*Primary Examiner* — John S Chu
(74) *Attorney, Agent, or Firm* — Oblon, McClelland, Maier & Neustadt, L.L.P.

(57) ABSTRACT

A pattern-forming method includes applying a radiation-sensitive composition comprising a complex on a substrate to provide a film on the substrate. The film is exposed. The film exposed is developed. The complex includes: a metal-containing component that is a transition metal compound having a hydrolyzable group, a hydrolysis product of the transition metal compound having a hydrolyzable group, a hydrolytic condensation product of the transition metal compound having a hydrolyzable group, or a combination thereof; and an organic compound represented by formula (1). In the formula (1), $R^1$ represents an organic group having a valency of n, n being an integer of 1 to 4. In a case where n is 1, X represents —COOH. In a case where n is 2 to 4, X represents —OH, —COOH, —NCO, —NHR$^a$, —COOR$^A$ or —CO—C(R$^L$)$_2$—CO—R$^A$.

$$R^1\!-\!(X)_n \qquad (1)$$

20 Claims, 1 Drawing Sheet

US 10,725,376 B2

PATTERN-FORMING METHOD

CROSS-REFERENCE TO RELATED APPLICATIONS

The present application is a continuation application of International Application No. PCT/JP2015/076203, filed Sep. 15, 2015, which claims priority to Japanese Patent Application No. 2014-189178, filed Sep. 17, 2014. The contents of these applications are incorporated herein by reference in their entirety.

BACKGROUND OF THE INVENTION

Field of the Invention

The present invention relates to a pattern-forming method.

Discussion of the Background

Radiation-sensitive compositions used for microfabrication by lithography generate acids in regions by irradiation with: far ultraviolet rays such as an ArF excimer laser beam and a KrF excimer laser beam; electromagnetic waves such as extreme ultraviolet ray (EUV); charged particle rays such as an electron beam; and the like, making a difference in a rate of dissolution in a developer solution between the light-exposed regions and light-unexposed regions, through a chemical reaction in which the acid acts as a catalyst, whereby a pattern is formed on a substrate.

Miniaturization in processing techniques has been accompanied by demands for improved resist performances of such radiation-sensitive compositions. To address the demands, types and molecular structures of polymers, acid generators and other components to be used in a composition have been studied, and combinations thereof have also been extensively studied (refer to Japanese Unexamined Patent Application, Publication Nos. H11-125907, H8-146610, and 2000-298347).

SUMMARY OF THE INVENTION

According to one aspect of the present invention, a pattern-forming method includes applying a radiation-sensitive composition comprising a complex on a substrate to provide a film on the substrate. The film is exposed. The film exposed is developed. The complex is a reaction product from a mixture of: a metal-containing component that is a transition metal compound having a hydrolyzable group, a hydrolysis product of the transition metal compound having a hydrolyzable group, a hydrolytic condensation product of the transition metal compound having a hydrolyzable group, or a combination thereof; and an organic compound represented by formula (1).

(1)

In the formula (1), $R^1$ represents an organic group having a valency of n, n being an integer of 1 to 4. In a case where n is 1, X represents —COOH. In a case where n is 2 to 4, X represents —OH, —COOH, —NCO, —NHR$^a$, —COOR$^A$ or —CO—C(R$^L$)$_2$—CO—R$^A$, R$^a$ representing a hydrogen atom or a monovalent organic group, R$^A$ each independently representing a monovalent organic group, and R$^L$ each independently representing a hydrogen atom or a monovalent organic group. In a case where n is no less than 2, a plurality of Xs are identical or different.

DESCRIPTION OF THE EMBODIMENTS

Figure 1:
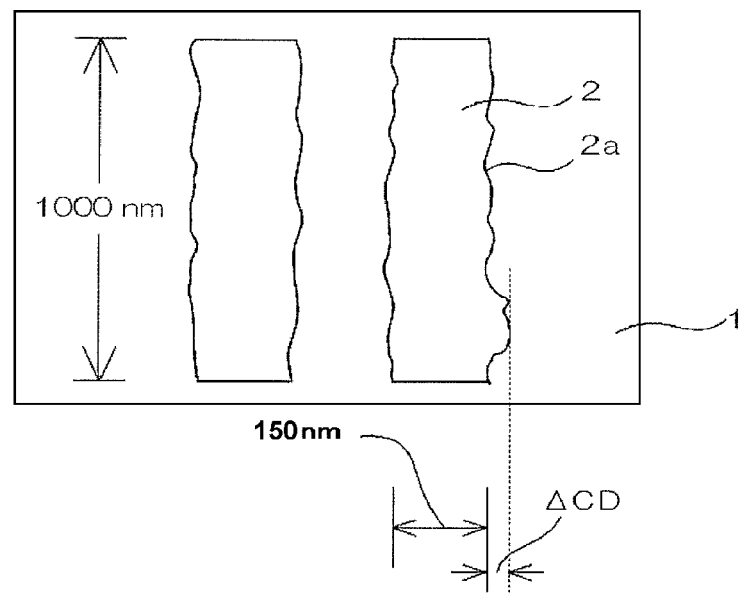
FIG. 1 shows a schematic plan view illustrating a line-pattern when seen from above.

According to an embodiment of the invention, a pattern-forming method comprises: providing a film (hereinafter, may be also referred to as "film-providing step"); exposing the film (hereinafter, may be also referred to as "exposing step"); and developing the film exposed (hereinafter, may be also referred to as "developing step"), wherein the film is formed by using a radiation-sensitive composition comprising a complex (hereinafter, may be also referred to as "(M) mixed complex" or "mixed complex (M)") obtained by mixing: a metal-containing component (hereinafter, may be also referred to as "(A) metal-containing compound" or "metal-containing compound (A)") that is a transition metal compound (I) having a hydrolyzable group, a hydrolysis product of the transition metal compound (I) having a hydrolyzable group, a hydrolytic condensation product of the transition metal compound (I) having a hydrolyzable group, or a combination thereof; with an organic compound (hereinafter, may be also referred to as "(B) organic compound" or "organic compound (B)") represented by the following formula (1):

(1)

wherein $R^1$ represents an organic group having a valency of n; n is an integer of 1 to 4; in a case where n is 1, X represents —COOH; in a case where n is 2 to 4, X represents —OH, —COOH, —NCO, —NHR$^a$, —COOR$^A$ or —CO—C(R$^L$)$_2$—CO—R$^A$, R$^a$ representing a hydrogen atom or a monovalent organic group, R$^A$ each independently representing a monovalent organic group, and R$^L$ each independently representing a hydrogen atom or a monovalent organic group; and in a case where n is no less than 2, a plurality of Xs may be identical or different.

The embodiment of the present invention enables a pattern superior in nanoedge roughness property to be formed with high sensitivity. Therefore, the pattern-forming method can be suitably used for a processing process of semiconductor devices, and the like, in which further progress of miniaturization is expected in the future. Hereinafter, embodiments of the present invention will be described in detail. It is to be noted that the present invention is not limited to the following embodiments.

Pattern-Forming Method

The pattern-forming method comprises a film-providing step, an exposing step, and a developing step. In the pattern-forming method, the film is formed by using the radiation-sensitive composition comprising the mixed complex (M) obtained by mixing the metal-containing compound (A) with the organic compound (B). Hereinafter, each step is explained.

Film-Providing Step

In this step, a film is provided by using the radiation-sensitive composition (described later). The film may be provided by, for example, applying the radiation-sensitive composition on a substrate. An application procedure is not particularly limited, and an appropriate application procedure such as spin-coating, cast coating, roller coating, etc. may be employed. Examples of the substrate include a silicon wafer, a wafer coated with aluminum, and the like. Specifically, the radiation-sensitive composition is applied such that a resulting film has a predetermined thickness, followed by prebaking (PB) to evaporate a solvent in the coating film as needed. An average thickness of the coating film is preferably no less than 10 nm and no greater than 500 nm. The lower limit of a temperature for the PB is preferably 60° C., and more preferably 80° C. The upper limit of the temperature for the PB is preferably 140° C., and more preferably 120° C. The lower limit of a time period for the PB is preferably 5 sec, and more preferably 10 sec. The upper limit of the time period for the PB is preferably 600 sec, and more preferably 300 sec.

In the embodiment of the present invention, an organic or inorganic antireflective film may also be formed beforehand on a substrate to be used, in order to maximize potential of the radiation-sensitive composition. Furthermore, in order to inhibit an influence of basic impurities, etc., in the environmental atmosphere, for example, a protective film may be provided on the coating film. In a case of conducting liquid immersion lithography, in order to avoid a direct contact between a liquid immersion medium and the film, a protective film for liquid immersion may also be provided on the film.

Radiation-Sensitive Composition

The radiation-sensitive composition comprises the mixed complex (M) obtained by mixing the metal-containing compound (A) with an organic compound (B). The radiation-sensitive composition may further comprise as other components a radiation-sensitive acid generating agent (C), a solvent (D), a surfactant (E), and the like.

(A) Metal-Containing Compound

The metal-containing compound (A) (metal-containing component) is: a transition metal compound (I) having a hydrolyzable group; a hydrolysis product of the transition metal compound (I) having a hydrolyzable group; a hydrolytic condensation product of the transition metal compound (I) having a hydrolyzable group; or a combination thereof.

The hydrolyzable group is exemplified by a halogen atom, an alkoxy group, a carboxylate group, and the like.

Examples of the halogen atom include a fluorine atom, a chlorine atom, a bromine atom, an iodine atom, and the like.

Examples of the alkoxy group include a methoxy group, an ethoxy group, a propoxy group, a butoxy group, and the like.

Examples of the carboxylate group include a formate group, an acetate group, a propionate group, a butyrate group, a benzoate group, an oxalate group, a (meth)acrylate group, and the like.

As the hydrolyzable group, an alkoxy group is preferred, and an isopropoxy group and a butoxy group are more preferred.

A transition metal atom is exemplified by atoms of metal elements from groups 3, 4, 5, 6, 7, 8, 9, 10, and 11. Of these, atoms of metal elements from the groups 4 to 6 and 8 are preferred, and atoms of titanium, zirconium, hafnium, tantalum, tungsten and iron are more preferred.

The transition metal compound (I) may be used either alone of one type, or in combination of two or more types thereof. In a case in which the metal-containing compound (A) is a hydrolytic condensation product of the transition metal compound (I), the transition metal compound (I) may have been hydrolytically condensed with a compound having a hydrolyzable group comprising a metal atom other than the transition metal, within a range not leading to impairment of the effects of the embodiments of the present invention. Therefore, the hydrolytic condensation product of the transition metal compound (I) may also comprise a metal atom other than the transition metal, within a range not leading to impairment of the effects of the embodiments of the present invention. The metal atom other than the transition metal is exemplified by a silicon atom. The upper limit of a content of the metal atom other than the transition metal is preferably 50 atomic %, more preferably 30 atomic %, and further more preferably 10 atomic % with respect to total metal atoms in the hydrolytic condensation product and the like.

The transition metal compound (I) is exemplified by compounds represented by the following formula (2), and the like.

$$L_aMY_b \qquad (2)$$

In the above formula (2), M represents the transition metal atom; L represents a ligand; a is an integer of 0 to 2, wherein in a case where a is 2, a plurality of Ls are identical or different; Y represents the hydrolyzable group selected from a halogen atom, an alkoxy group and a carboxylate group; and b is an integer of 2 to 6, wherein a plurality of Ys may be identical or different, and L represents a ligand that does not fall under the definition of Y.

The transition metal atom represented by M is exemplified by atoms of metal elements from groups 3, 4, 5, 6, 7, 8, 9, 10, and 11. Of these, atoms of metal elements from the groups 4 to 6 and 8 are preferred, and atoms of titanium, zirconium, hafnium, tantalum, tungsten, and iron are more preferred.

The ligand represented by L is exemplified by a monodentate ligand and a polydentate ligand.

Exemplary monodentate ligand includes a hydroxo ligand, a carboxy ligand, an amido ligand, and the like.

Examples of the amido ligand include an unsubstituted amido ligand ($NH_2$), a methylamido ligand (NHMe), a dimethylamido ligand ($NMe_2$), a diethylamido ligand ($NEt_2$), a dipropylamido ligand ($NPr_2$), and the like.

Exemplary polydentate ligand includes a hydroxy acid ester, a β-diketone, a β-ketoester, a β-dicarboxylic acid ester, a hydrocarbon having a π bond, a diphosphine, a carboxylic acid compound, ammonia, and the like.

Examples of the hydroxy acid ester include glycolic acid esters, lactic acid esters, 2-hydroxycyclohexane-1-carboxylic acid esters, salicylic acid esters, and the like.

Examples of the β-diketone include acetylacetone, methylacetylacetone, ethylacetylacetone, 3-methyl-2,4-pentanedione, and the like.

Examples of the β-ketoester include acetoacetic acid esters, α-alkyl-substituted acetoacetic acid esters, β-ketopentanoic acid esters, benzoylacetic acid esters, 1,3-acetonedicarboxylic acid esters, and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like.

Examples of the hydrocarbon having a π bond include:
chain olefins such as ethylene and propylene;
cyclic olefins such as cyclopentene, cyclohexene and norbornene;
chain dienes such as butadiene and isoprene;
cyclic dienes such as cyclopentadiene, methylcyclopentadiene, pentamethylcyclopentadiene, cyclohexadiene and norbornadiene;
aromatic hydrocarbons such as benzene, toluene, xylene, hexamethylbenzene, naphthalene and indene; and the like.

Examples of the diphosphine include 1,1-bis(diphenylphosphino)methane, 1,2-bis(diphenylphosphino)ethane, 1,3-bis(diphenylphosphino)propane, 2,2'-bis(diphenylphosphino)-1,1'-binaphthyl, 1,1'-bis(diphenylphosphino)ferrocene, and the like.

The carboxylic acid compound is preferably a monocarboxylic acid compound having no less than 6 carbon atoms, examples of which include caprylic acid, caprylic acid, capric acid, stearic acid, benzoic acid, and the like.

Examples of the halogen atom which may be represented by Y include a fluorine atom, a chlorine atom, a bromine atom, an iodine atom, and the like.

Examples of the alkoxy group which may be represented by Y include a methoxy group, an ethoxy group, a propoxy group, a butoxy group, and the like.

As the carboxylate group which may be represented by Y, a formate group and an alkylcarbonyloxy group having 5 or less carbon atoms are preferred. Examples of the alkylcarbonyloxy group having 5 or less carbon atoms include an acetate group, a propionate group, a butyrate group, a valerate group, and the like.

As Y, an alkoxy group is preferred, and an isopropoxy group and a butoxy group are more preferred.

In the above formula (2), b is preferably 4. It is further preferred that in the above formula (2), b is 4 and Y represents an alkoxy group.

As the metal-containing compound (A), a metal alkoxide that is neither hydrolyzed nor hydrolytically condensed is preferred. When the metal-containing compound is the aforementioned metal alkoxide, the nanoedge roughness property is enabled to be further improved.

The metal-containing compound (A) is exemplified by zirconium.n-butoxide, zirconium.n-propoxide, hafnium.ethoxide, hafnium.isopropoxide, tantalum.ethoxide, tungsten.methoxide, iron chloride, titanium.n-butoxide, titanium.n-propoxide, zirconium.di n-butoxide.bis(2,4-pentanedionate), titanium.tri-n-butoxide.stearate, bis(cyclopentadienyl)hafnium dichloride, bis(cyclopentadienyl)tungsten dichloride, diacetato[(S)-(−)-2,2'-bis(diphenylphosphino)-1, 1'-binaphtyl]ruthenium, dichloro[ethylenebis[diphenylphosphine]]cobalt, a titanium butoxide oligomer, aminopropyltrimethoxytitanium, aminopropyltriethoxyzirconium, 2-(3,4-epoxycyclohexyl)ethyltrimethoxyzirconium, γ-glycidoxypropyltrimethoxyzirconium, 3-isocyanopropyltrimethoxyzirconium, 3-isocyanopropyltriethoxyzirconium, triethoxymono(acetylacetonato)titanium, tri-n-propoxymono(acetylacetonato)titanium, tri-i-propoxymono(acetylacetonato)titanium, triethoxymono(acetylacetonato)zirconium, tri-n-propoxymono(acetylacetonato)zirconium, tri-i-propo- xy-mono(acetylacetonato)zirconium, titanium tributoxymonostearate, diisopropoxybis acetylacetonate, di n-butoxybis (acetylacetonate)titanium, di n-butoxybis(acetylacetonate) zirconium, tri(3-methacryloxypropyl)methoxyzirconium, tri (3-acryloxypropyl)methoxyzirconium, and the like.

(B) Organic Compound

The organic compound (B) is represented by the following formula (1).

$$R^1\text{-}(X)_n \qquad (1)$$

In the above formula (1), $R^1$ represents an organic group having a valency of n, n being an integer of 1 to 4, wherein; in a case where n is 1, X represents —COOH; in a case where n is 2 to 4, X represents —OH, —COOH, —NCO, —NHR$^a$, —COOR$^A$ or —CO—C(R$^L$)$_2$—CO—R$^A$, R$^a$ representing a hydrogen atom or a monovalent organic group, R$^A$ each independently representing a monovalent organic group, and R$^L$ each independently representing a hydrogen atom or a monovalent organic group; and in a case where n is no less than 2, a plurality of Xs may be identical or different.

The organic group having a valency of n which is represented by $R^1$ is exemplified by: a hydrocarbon group having a valency of n; a hetero atom-containing group that has a valency of n and includes between two carbon atoms in the hydrocarbon group, a group having a hetero atom; a group having a valency of n which is obtained by substituting with a substituent, a part or all of hydrogen atoms included in the hydrocarbon group or the hetero atom-containing group; and the like.

Examples of the hydrocarbon group having a valency of n include groups obtained by removing n hydrogen atoms from hydrocarbons such as chain hydrocarbons having 1 to 30 carbon atoms such as: alkanes, e.g., methane, ethane, propane and butane; alkenes, e.g., ethene, propene, butene and pentene; alkynes, e.g., ethyne, propyne, butyne and pentyne; and the like, alicyclic hydrocarbons having 3 to 30 carbon atoms such as: cycloalkanes, e.g., cyclopropane, cyclobutane, cyclopentane, cyclohexane, norbornane and adamantane; cycloalkenes, e.g., cyclopropene, cyclobutene, cyclopentene, cyclohexene and norbornene; and the like, and aromatic hydrocarbons having 6 to 30 carbon atoms, e.g., arenes such as benzene, toluene, xylene, mesitylene, naphthalene, methylnaphthalene, dimethylnaphthalene and anthracene; and the like.

The group having a hetero atom is exemplified by: groups that include an oxygen atom, a nitrogen atom, a silicon atom, a phosphorus atom, a sulfur atom, or a combination thereof; and the like, and specific examples thereof include —O—, —NH—, —CO—, —S—, a combination thereof, and the like. Of these, —O— is preferred.

Examples of the substituent include:

halogen atoms such as a fluorine atom, a chlorine atom, a bromine atom and an iodine atom;

alkoxy groups such as a methoxy group, an ethoxy group and a propoxy group;

alkoxycarbonyl groups such as a methoxycarbonyl group and an ethoxycarbonyl group;

alkoxycarbonyloxy groups such as a methoxycarbonyloxy group and an ethoxycarbonyloxy group;

acyl groups such as a formyl group, an acetyl group, a propionyl group, a butyryl group and a benzoyl group;

a cyano group, and a nitro group; and the like.

The monovalent organic group which may be represented by $R^a$ in the —NHR$^a$ is exemplified by: a monovalent hydrocarbon group having 1 to 20 carbon atoms; a hetero atom-containing group that includes between two carbon atoms in the hydrocarbon group, a group having a hetero atom; a group which is obtained by substituting with a substituent, a part or all of hydrogen atoms included in the hydrocarbon group or the hetero atom-containing group; and the like. R$^a$ represents preferably a monovalent hydrocarbon group, more preferably a monovalent chain hydrocarbon group, further more preferably an alkyl group, and particularly preferably a methyl group.

The monovalent organic group represented by $R^A$ in the above —COOR$^A$ and —CO—C(R$^L$)$_2$—CO—R$^A$ is exemplified by monovalent organic groups similar to those exemplified in connection with the above R$^a$.

The monovalent organic group which may be represented by $R^L$ in the —CO—C(R$^L$)$_2$—CO—R$^A$ is exemplified by monovalent organic groups similar to those exemplified in connection with the R$^a$. It is to be noted that a plurality of R$^L$s may be identical or different.

When n is 1, the $R^1$ represents preferably a monovalent chain hydrocarbon group, a monovalent aromatic hydrocarbon group or a monovalent hetero atom-containing group, more preferably an alkyl group or an alkenyl group, and further more preferably a propyl group or a 2-propenyl group.

When n is 2, $R^1$ represents preferably a divalent chain hydrocarbon group, a divalent aromatic hydrocarbon group or a divalent hetero atom-containing group, more preferably an alkanediyl group, an alkenediyl group, an arenediyl group or an alkanediyloxyalkanediyl group, and further more preferably a 1,2-ethanediyl group, a 1,2-propanediyl group, a butanediyl group, a hexanediyl group, an ethenediyl group, a xylenediyl group or an ethanediyloxyethanediyl group.

When n is 3, $R^1$ represents preferably a trivalent chain hydrocarbon group, more preferably an alkanetriyl group, and further more preferably a 1,2,3-propanetriyl group.

When n is 4, $R^1$ represents preferably a tetravalent chain hydrocarbon group, more preferably an alkanetetrayl group, and further more preferably a 1,2,3,4-butanetetrayl group.

The organic compound (B) is exemplified by compounds represented by the following formulae (1-1) to (1-7) (hereinafter, may be also referred to as "compounds (1-1) to (1-7)"), and the like.

$$R^1\text{---}(OH)_n \quad (1\text{-}1)$$

$$R^1\text{---}(COOH)_n \quad (1\text{-}2)$$

$$R^1\text{---}(NCO)_n \quad (1\text{-}3)$$

$$R^1\text{---}(NHR^a)_n \quad (1\text{-}4)$$

$$R^1\text{---}(COOR^A)_n \quad (1\text{-}5)$$

$$R^1\text{---}(COC(R^L)_2COR^A)_n \quad (1\text{-}6)$$

$$(HO)_p\text{---}R^1\text{---}(COOR^A)_q \quad (1\text{-}7)$$

In the above formulae (1-1) to (1-7), $R^1$, $R^a$, $R^A$, and $R^L$ are as defined in the above formula (1).

In the above formulae (1-1) and (1-3) to (1-6), n is an integer of 2 to 4.

In the above formula (1-2), n is an integer of 1 to 4.

In the above formula (1-7), p is an integer of 1 to 3, and q is an integer of 1 to 3, wherein p+q is 2 to 4.

Examples of the compound (1-1) include,
when n is 2:
alkylene glycols such as ethylene glycol, propylene glycol, butylene glycol and hexamethylene glycol;
dialkylene glycols such as diethylene glycol, dipropylene glycol, dibutylene glycol, triethylene glycol and tripropylene glycol;
cycloalkylene glycols such as cyclohexanediol, cyclohexanedimethanol, norbornanediol, norbornanedimethanol and adamantanediol;
aromatic ring-containing glycols such as 1,4-benzenedimethanol and 2,6-naphthalenedimethanol;
divalent phenols such as catechol, resorcinol and hydroquinone; and the like,
when n is 3:
alkanetriols such as glycerin and 1,2,4-butanetriol;
cycloalkanetriols such as 1,2,4-cyclohexanetriol and 1,2,4-cyclohexanetrimethanol;
aromatic ring-containing glycols such as 1,2,4-benzenetrimethanol and 2,3,6-naphthalenetrimethanol;
trivalent phenols such as pyrogallol and 2,3,6-naphthalenetriol; trimethylolpropane ethoxylate; and the like,
and when n is 4:
alkanetetraols such as erythritol and pentaerythritol;
cycloalkanetetraols such as 1,2,4,5-cyclohexanetetraol;
aromatic ring-containing tetraols such as 1,2,4,5-benzenetetramethanol;
tetravalent phenols such as 1,2,4,5-benzenetetraol; and the like. Of these, the compounds (1-1) in which n is 2 and 3 are more preferred, alkylene glycols, dialkylene glycols, alkanetriols and trimethylolpropane ethoxylate are further more preferred, and propylene glycol, diethylene glycol, glycerin and trimethylolpropane ethoxylate are particularly preferred.

Examples of the compound (1-2) include,
when n is 1:
chain saturated monocarboxylic acids such as acetic acid and propionic acid;
unsaturated monocarboxylic acids such as acrylic acid, methacrylic acid and tiglic acid;
alicyclic monocarboxylic acids such as cyclohexanecarboxylic acid, norbornanecarboxylic acid and adamantanecarboxylic acid;
aromatic monocarboxylic acids such as benzoic acid and naphthalenecarboxylic acid; and the like,
when n is 2:
chain saturated dicarboxylic acids such as oxalic acid, malonic acid, succinic acid, glutaric acid and adipic acid;
chain unsaturated dicarboxylic acids such as maleic acid and fumaric acid;
alicyclic dicarboxylic acids such as 1,4-cyclohexanedicarboxylic acid, norbornanedicarboxylic acid and adamantanedicarboxylic acid;
aromatic dicarboxylic acids such as phthalic acid, terephthalic acid, 2,6-naphthalenedicarboxylic acid and 2,7-naphthalenedicarboxylic acid; and the like,
when n is 3:
chain saturated tricarboxylic acids such as 1,2,3-propanetricarboxylic acid;
chain unsaturated tricarboxylic acids such as 1,2,3-propenetricarboxylic acid;
alicyclic tricarboxylic acids such as 1,2,4-cyclohexanetricarboxylic acid;
aromatic tricarboxylic acids such as trimellitic acid and 2,3,7-naphthalenetricarboxylic acid; and the like,
and when n is 4:
chain saturated tetracarboxylic acids such as 1,2,3,4-butanetetracarboxylic acid;
chain unsaturated tetracarboxylic acids such as 1,2,3,4-butadienetetracarboxylic acid;
alicyclic tetracarboxylic acids such as 1,2,5,6-cyclohexanetetracarboxylic acid and 2,3,5,6-norbornanetetracarboxylic acid;
aromatic tetracarboxylic acids such as pyromellitic acid and 2,3,6,7-naphthalenetetracarboxylic acid; and the like.

Of these, the compounds (1-2) in which n is 1 and 2 are preferred, chain saturated monocarboxylic acids, chain unsaturated monocarboxylic acids, chain saturated dicarboxylic acids and chain unsaturated dicarboxylic acids are more preferred, the compounds (1-2) in which n is 1 are further more preferred, and acetic acid, propionic acid, methacrylic acid, tiglic acid, succinic acid and maleic acid are particularly preferred.

Examples of the compound (1-3) include,
when n is 2:
chain diisocyanates such as ethylene diisocyanate, trimethylene diisocyanate, tetramethylene diisocyanate and hexamethylene diisocyanate;
alicyclic diisocyanates such as 1,4-cyclohexane diisocyanate and isophorone diisocyanate;

aromatic diisocyanates such as tolylene diisocyanate, 1,4-benzene diisocyanate and 4,4'-diphenylmethane diisocyanate; and the like, when n is 3:

chain triisocyanates such as trimethylene triisocyanate;

alicyclic triisocyanates such as 1,2,4-cyclohexane triisocyanate;

aromatic triisocyanates such as 1,2,4-benzene triisocyanate; and the like, and when n is 4:

chain tetraisocyanates such as tetramethylene tetraisocyanate;

alicyclic tetraisocyanates such as 1,2,4,5-cyclohexane tetraisocyanate;

aromatic tetraisocyanates such as 1,2,4,5-benzene tetraisocyanate; and the like.

Of these, the compounds (1-3) in which n are 2 is more preferred, chain diisocyanates are further more preferred, and hexamethylene diisocyanate is particularly more preferred.

Examples of the compound (1-4) include, when n is 2:

chain diamines such as ethylenediamine, N-methylethylenediamine, N,N'-dimethylethylenediamine, trimethylenediamine, N,N'-dimethyltrimethylenediamine, tetramethylenediamine and N,N'-dimethyltetramethylenediamine;

alicyclic diamines such as 1,4-cyclohexanediamine and 1,4-di(aminomethyl)cyclohexane;

aromatic diamines such as 1,4-diaminobenzene and 4,4'-diaminodiphenylmethane; and the like, when n is 3:

chain triamines such as triaminopropane and N,N',N''-trimethyltriaminopropane;

alicyclic triamines such as 1,2,4-triaminocyclohexane;

aromatic triamines such as 1,2,4-triaminobenzene; and the like, and when n is 4:

chain tetraamines such as tetraaminobutane;

alicyclic tetraamines such as 1,2,4,5-tetraaminocyclohexane and 2,3,5,6-tetraaminonorbornane;

aromatic tetraamines such as 1,2,4,5-tetraaminobenzene; and the like. Of these, the compounds (1-4) in which n is 2 are more preferred, chain diamines are further more preferred, and N,N'-dimethylethylenediamine is particularly preferred.

Examples of the compound (1-5) include, when n is 2:

chain saturated dicarboxylic acid diesters such as an oxalic acid diester, a malonic acid diester, a succinic acid diester, a glutaric acid diester and an adipic acid diester;

chain unsaturated dicarboxylic acid diesters such as a maleic acid diester and a fumaric acid diester;

alicyclic dicarboxylic acid diesters such as a 1,4-cyclohexanedicarboxylic acid diester, a norbornanedicarboxylic acid diester and an adamantanedicarboxylic acid diester;

aromatic dicarboxylic acid diesters such as a phthalic acid diester, a terephthalic acid diester, a 2,6-naphthalenedicarboxylic acid diester and a 2,7-naphthalenedicarboxylic acid diester; and the like, when n is 3:

chain saturated tricarboxylic acid triesters such as a 1,2,3-propanetricarboxylic acid triester;

chain unsaturated tricarboxylic acid triesters such as a 1,2,3-propenetricarboxylic acid triester;

alicyclic tricarboxylic acid triesters such as a 1,2,4-cyclohexanetricarboxylic acid triester;

aromatic tricarboxylic acid triesters such as a trimellitic acid triester and a 2,3,7-naphthalenetricarboxylic acid triester; and the like, and when n is 4:

chain saturated tetracarboxylic acid tetraesters such as a 1,2,3,4-butanetetracarboxylic acid tetraester;

chain unsaturated tetracarboxylic acid tetraesters such as a 1,2,3,4-butadienetetracarboxylic acid tetraester;

alicyclic tetracarboxylic acid tetraesters such as a 1,2,5,6-cyclohexanetetracarboxylic acid tetraester and a 2,3,5,6-norbornanetetracarboxylic acid tetraester;

aromatic tetracarboxylic acid tetraesters such as a pyromellitic acid tetraester and a 2,3,6,7-naphthalenetetracarboxylic acid tetraester; and the like. Of these, the compounds (1-5) in which n is 2 are more preferred, chain saturated dicarboxylic acid diesters are further more preferred, and a succinic acid diester and a maleic acid diester are particularly preferred.

As the compound (1-6), the compounds (1-6) which n is 2 are preferred, examples of which include, when n is 2, 2,4,6,8-nonanetetraone, 2,4,7,9-decatetraone, a 3,5-dioxo-heptane-1,7-dicarboxylic acid ester, a 3,6-dioxo-octane-1,8-dicarboxylic acid ester, and the like.

As the compound (1-7), the compounds (1-7) in which p is 1 and q is 1 are preferred, examples of which include, glycolic acid esters, lactic acid esters, 2-hydroxycyclohexane-1-carboxylic acid, salicylic acid esters, and the like. Of these, lactic acid esters are preferred, and ethyl lactate is more preferred.

(M) Mixed Complex

The radiation-sensitive composition comprises the mixed complex (M). Although not necessarily clarified, and without wishing to be bound by any theory, the reason for achieving the effects described above due to the pattern-forming method in which the radiation-sensitive composition comprises the mixed complex (M) is inferred as in the following. Specifically, a polynuclear complex is formed as a result of mixing the metal-containing compound (A) with the organic compound (B), and when the polynuclear complex is exposed, a degree of polynuclearity thereof is further elevated, whereby the solubility thereof in a developer solution would be extremely decreased.

The mixed complex (M) is obtained by mixing the metal-containing compound (A) with an organic compound (B). The mixing can be carried out by a known process.

The lower limit of an amount of the organic compound (B) used in the mixing is preferably 0.01 mol and more preferably 0.1 mol, with respect to 1 mol of the metal comprised in the metal-containing compound (A). The upper limit of the amount of the organic compound (B) used is preferably 30 mol, more preferably 20 mol, and further more preferably 15 mol.

The lower limit of a temperature for the mixing is preferably 0° C., and more preferably 10° C. The upper limit of the temperature for the mixing is preferably 200° C., and more preferably 150° C.

The lower limit of a time period for the mixing is preferably 5 min, and more preferably 10 min. The upper limit of the time period for the mixing is preferably 1 week, and more preferably 3 days.

Other compound may also be added in formation of the mixed complex, as a component constituting the polynuclear complex in addition to the metal-containing compound (A) and the organic compound (B), within the range not leading to impairment of the effects of the embodiment of the present invention. The other compound is exemplified by a silicon compound having a hydrolyzable group, a hydrolysis product thereof, a hydrolytic condensation product thereof, and the like. In relation to an amount of these compounds used, an amount of silicon atom comprised in these compounds with respect to 1 mol of the transition metal atom comprised in the metal-containing compound (A) is preferably no greater than 1 mol, more preferably no greater than 0.5 mol, and further more preferably no greater than 0.1 mol.

The mixed complex (M) may also have been obtained by further mixing with a β-diketone, a β-ketoester, a β-dicarboxylic acid ester, or a combination thereof (hereinafter, may be also referred to as a "compound X"). In this case, due to the compound X coordinated to the polynuclear complex comprised in the mixed complex (M), the solubility of the mixed complex (M) in the solvent (D) is improved.

The β-diketone is not particularly limited as long as it is a compound having a 1,3-diketo structure, and examples thereof include a compound represented by the following formula (3), and the like.

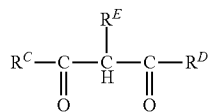
(3)

In the above formula (3), $R^C$ and $R^D$ each independently represent a monovalent organic group having 1 to 20 carbon atoms; and $R^E$ represents a hydrogen atom or a monovalent organic group having 1 to 20 carbon atoms.

Examples of the monovalent organic group having 1 to 20 carbon atoms which may be represented by $R^C$, $R^D$ and $R^E$ include groups similar to those exemplified in connection with the monovalent organic group which may be represented by $R^a$ in the above formula (1), and the like.

Examples of the β-diketone include acetyl acetone, methylacetylacetone, ethylacetylacetone, 3-methyl-2,4-pentanedione, and the like. Of these, acetylacetone is preferred.

The β-ketoester is not particularly limited as long as it is a compound having a ketonic carbonyl group at the β-position of a carboxylic acid ester, and examples thereof include a compound represented by the following formula (4), and the like.

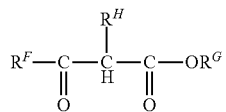
(4)

In the above formula (4), $R^F$ and $R^G$ each independently represent a monovalent organic group having 1 to 20 carbon atoms; and $R^H$ represents a hydrogen atom or a monovalent organic group having 1 to 20 carbon atoms.

Examples of the monovalent organic group having 1 to 20 carbon atoms which may be represented by $R^F$, $R^G$, and $R^H$ include groups similar to those exemplified in connection with the monovalent organic group which may be represented by $R^a$ in the above formula (1), and the like.

Examples of the β-ketoester include acetoacetic acid esters, α-alkyl-substituted acetoacetic acid esters, β-ketopentanoic acid esters, benzoylacetic acid esters, 1,3-acetonedicarboxylic acid diesters, and the like. Of these, acetoacetic acid esters and 1,3-acetonedicarboxylic acid diesters are preferred, and ethyl acetoacetate and diethyl-1,3-acetonedicarboxylate are more preferred.

The β-dicarboxylic acid ester is not particularly limited as long as it is a compound having a structure in which two ester groups bind to the same carbon atom, and examples thereof include a compound represented by the following formula (5), and the like.

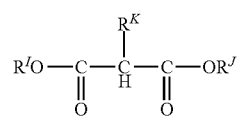
(5)

In the above formula (5), $R^I$ and $R^J$ each independently represent a monovalent organic group having 1 to 20 carbon atoms; and $R^K$ represents a hydrogen atom or a monovalent organic group having 1 to 20 carbon atoms.

Examples of the monovalent organic group having 1 to 20 carbon atoms which may be represented by $R^I$, $R^J$, and $R^K$ include groups similar to those exemplified in connection with the monovalent organic group which may be represented by $R^a$ in the above formula (1), and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like. Of these, malonic acid diesters are preferred and diethyl malonate is more preferred.

The lower limit of a proportion of the compound X used in the mixing of the compound X and the mixed complex (M) is preferably 0.01 mol and more preferably 0.1 mol with respect to 1 mol of the metal comprised in the mixed complex (M). The upper limit of the proportion of the compound X used in the mixing is preferably 1,000 mol, more preferably 100 mol, and further more preferably 50 mol.

The lower limit of a temperature for the mixing is preferably 0° C., and more preferably 10° C. The upper limit of the temperature for the mixing is preferably 200° C., and more preferably 150° C.

The lower limit of a time period for the mixing is preferably 1 min, and more preferably 5 min. The upper limit of the time period for the mixing is preferably 48 hrs, and more preferably 24 hrs.

The content of the mixed complex (M) in the radiation-sensitive composition with respect to the total solid content in the radiation-sensitive composition is preferably no less than 70% by mass, more preferably no less than 80% by mass, and further more preferably no less than 85% by mass. The "total solid content" as referred to means the sum of the components other than the solvent.

(C) Radiation-Sensitive Acid Generating Agent

The radiation-sensitive acid generating agent (C) is a substance that generates an acid upon exposure to a radioactive ray. Examples of the radioactive ray include: electromagnetic waves such as ultraviolet rays, visible light rays, far ultraviolet rays, X-rays and γ radiations; charged particle rays such as electron beams and α-rays; and the like. In a case where the radiation-sensitive composition comprises the acid generating agent, an effect of improving dissolution contrast may be achieved.

The radiation-sensitive acid generating agent (C) is exemplified by an onium salt compound, a N-sulfonyloxyimide compound, a halogen-containing compound, a diazo ketone compound, and the like. Of these radiation-sensitive acid generating agents (C), an onium salt compound is preferred.

Exemplary onium salt compound includes a sulfonium salt, a tetrahydrothiophenium salts, an iodonium salt, a phosphonium salt, a diazonium salt, a pyridinium salt, and the like.

Examples of the sulfonium salt include: triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium2-bicyclo[2.2.1]hept-2-yl-1,1,2,2-tetrafluoroethanesulf ovate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)-hexane-1-sulfonate, 2-(1-adamantyl)-1,1-difluoroethane sulfonate, triphenylsulfonium 2-(adamantane-1-yl carbonyloxy)-1,1,3,3,3-pentafluoropropane-1-sulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulphonate, 1-(4-n-butoxynaphthalen-1-yl)tetrahydrothiophenium hexafluoropropylene sulfonimide, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulphonate, 1-(6-n-butoxynaphthalen-2-yl)tetrahydrothiophenium hexafluoropropylene sulfonimide, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, 1-(3,5-dimethyl-4-hydroxyphenyl)tetrahydrothiophenium hexafluoropropylene sulfonimide, and the like.

Examples of the iodonium salt include: diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like.

Of these, as the radiation-sensitive acid generating agent (C), onium salts are preferred, sulfonium salts and tetrahydrothiophenium salts are more preferred, triphenylsulfonium salts and 1-(4-n-butoxynaphthalene-1-yl)tetrahydrothiophenium salts are further more preferred, and triphenylsulfonium 2-(1-adamantyl)-1,1-difluoroethanesulfonate, triphenylsulfonium 2-(adamantane-1-yl carbonyloxy)-1,1,3,3,3-pentafluoropropane-1-sulfonate, 1-(4-n-butoxynaphthalene-1-yl)tetrahydrothiophenium hexafluoropropylene sulfonimide and triphenylsulfonium nonafluoro-n-butanesulfonate are particularly preferred.

These radiation-sensitive acid generating agents (C) may be used either alone of one type, or in combination of two or more types thereof. When the radiation-sensitive composition contains also the radiation-sensitive acid generating agent (C), the lower limit of a content of the radiation-sensitive acid generating agent (C) with respect to 100 parts by mass of the mixed complex (M) is preferably 0.1 parts by mass, more preferably 0.5 parts by mass, and still more preferably 1 part by mass. The upper limit of the content of the radiation-sensitive acid generating agent (C) is preferably 30 parts by mass, and more preferably 25 parts by mass. When the content of the radiation-sensitive acid generating agent (C) falls within this range, the effect of improving dissolution contrast is particularly likely to be achieved.

(D) Solvent

The radiation-sensitive composition typically contains the solvent (D). The solvent (D) is not particularly limited as long as it is a solvent capable of dissolving or dispersing at least the mixed complex (M), as well as other component(s) comprised as needed. The solvent (D) may be used either alone of one type, or in combination of two or more types thereof.

The solvent (D) is exemplified by alcohol solvents, ether solvents, ketone solvents, amide solvents, ester organic solvents, hydrocarbon solvents, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partially etherated solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partially etherated carboxylate solvents such as propylene glycol monomethyl ether acetate;

polyhydric carboxylic acid diester solvents such as diethyl oxalate;

carbonate solvents such as dimethyl carbonate and diethyl carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, alcohol solvents and ester solvents are preferred, and propylene glycol monomethyl ether, propylene glycol monoethyl ether, butanol, ethyl lactate and propylene glycol monomethyl ether acetate are particularly preferred.

(E) Surfactant

The surfactant (E) is a component that exhibits the effect of improving coating properties, striation and the like. Examples of the surfactant (E) include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, and polyethylene glycol dilaurate and polyethylene glycol distearate; commercially available products such as KP341 (Shin-Etsu Chemical Co., Ltd.), Polyflow No. 75 and Polyflow No. 95 (each available from Kyoeisha Chemical Co., Ltd.), EFTOP EF301, EFTOP EF303 and EFTOP EF352 (each available from Tochem Products Co. Ltd.), Megaface F171 and Megaface F173 (each available from Dainippon Ink and Chemicals, Incorporated), Fluorad FC430 and Fluorad FC431 (each available from Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (each available from Asahi Glass Co., Ltd.); and the like.

Preparation of Radiation-Sensitive Composition

The radiation-sensitive composition may be prepared, for example, by mixing the mixed complex (M) and the solvent (D), as well as components such as the radiation-sensitive acid generating agent (C) and the surfactant (E) as needed, at a certain ratio. The radiation-sensitive composition may be prepared in normal use by further adding a solvent to adjust the concentration thereof, and thereafter filtering the solution through a filter having a pore size of, for example, about 0.2 μm. The lower limit of the solid content concentration of the radiation-sensitive composition is preferably 0.1% by mass, more preferably 0.5% by mass, further more preferably 1% by mass, and particularly preferably 1.5% by mass. The upper limit of the solid content concentration is preferably 50% by mass, more preferably 30% by mass, further more preferably 20% by mass, and particularly preferably 10% by mass.

Exposure Step

In this step, the film provided in the film-providing step is exposed. The exposure is carried out by irradiating with a radioactive ray through a mask having a predetermined pattern, and through a liquid immersion medium such as water as needed. The radioactive ray is appropriately selected from: electromagnetic waves such as visible light rays, ultraviolet rays, far ultraviolet rays, extreme ultraviolet rays (EUV, wavelength: 13.5 nm), X-rays and γ radiations; charged particle rays such as electron beams and α-rays; and the like. Of these, radioactive rays that cause a metal to release secondary electrons upon an exposure thereto are preferred, and EUV and electron beams are more preferred.

Subsequent to the exposure, post exposure baking (PER) may be carried out. The lower limit of a temperature for the PEB is preferably 50° C., and more preferably 80° C. The upper limit of the temperature for the PER is preferably 180° C., and more preferably 130° C. The lower limit of a time period for the PEB is preferably 5 sec, and more preferably 10 sec. The upper limit of the time period for the PEB is preferably 600 sec, and more preferably 300 sec.

Development Step

In this step, the film exposed in the exposure step is developed. A developer solution to be used in the development is exemplified by an alkaline solution and an organic solvent. Therefore, in this step, development with an alkaline solution enables formation of a negative tone pattern. Alternatively, development with an organic solvent enables formation of a negative tone pattern.

Examples of the alkaline solution include: alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propyl amine, diethylamine, di-n-propylamine, triethylamine, methyldiethylamine, ethyldimethyl amine, triethanolamine, tetramethylammonium hydroxide (TMAH), pyrrole, piperidine, choline, 1,8-diazabicyclo[5.4.0]-7-undecene and 1,5-diazabicyclo-[4.3.0]-5-nonene; and the like.

Examples of the organic solvent include solvents similar to those exemplified in connection with the solvent (D) in the radiation-sensitive composition, and the like. Of these, ester solvents are preferred and butyl acetate is more preferred.

These developer solutions may be used either alone of one type, or in combination of two or more types thereof. The development is generally followed by washing with water and the like and drying.

The pattern-forming method can be suitably used for forming a resist pattern of a semiconductor device.

EXAMPLES

Hereinafter, the embodiments of the present invention are explained in detail by way of Examples, but the present invention is limited to these Examples.

Synthesis of Mixed Complex (M)

Metal-containing compounds used in the synthesis of the mixed complex (M) are shown below.

M-1: titanium(IV).tri-n-butoxide.stearate (90% by mass solution in butanol)
M-2: titanium(IV).butoxide oligomeric decamer [(TiO(OBu)$_2$]$_{10}$)
M-3: zirconium(IV).n-butoxide (80% by mass solution in butanol)
M-4: zirconium(IV).n-propoxide (70% by mass solution in 1-propanol)
M-5: hafnium(IV).ethoxide
M-6: hafnium(IV).isopropoxide
M-7: tantalum(V).ethoxide
M-8: tungsten(VI).methoxide
M-9: iron chloride(III) (anhydrous)
M-10: methyltrimethoxysilane Synthesis Example 1

10.0 g of the compound (M-1) was dissolved in 40.0 g of propylene glycol monoethyl ether (PGEE), and then a mixture of 10.0 g of PGEE and 0.46 g of maleic acid was added thereto. The resulting solution was stirred for 1 hour and then PGEE was added thereto to obtain a mixed complex solution (A-1) having a solid content concentration of 10.0% by mass.

Synthesis Example 2

15.0 g of the compound (M-2) was dissolved in 15.0 g of propylene glycol monomethyl ether (PGME), and then a mixture of 15.0 g of PGME and 1.5 g of trimethylolpropane ethoxylate was added thereto. The resulting solution was stirred for 1 hour and then 19.52 g of ethyl acetoacetate (EAcAc) was added thereto. The solution was further stirred for 1 hour and then PGEE was added thereto to obtain a mixed complex solution (A-2) having a solid content concentration of 10.0% by mass.

Synthesis Example 3

4.0 g of the compound (M-3) was dissolved in 10.0 g of tetrahydrofuran, and then 8.0 g of methacrylic acid was added thereto, followed by heating at room temperature for 24 hrs. The resulting solution was mixed with 100 g of hexane, and the precipitates thus generated were collected, washed with hexane, and dried in vacuo to give 2.5 g of a zirconium complex. The zirconium complex was dissolved in ethyl lactate (EL) and the solution was stirred for 1 hour, whereby a mixed complex solution (A-3) having a solid content concentration of 10.0% by mass was obtained.

Synthesis Example 4

4.0 g of the compound (M-4) was dissolved in 10.0 g of tetrahydrofuran, and then 7.4 g of propionic acid was added thereto, followed by heating at 5° C. for 24 hrs. The resulting solution was mixed with 100 g of hexane, and the precipitates thus generated were collected, washed with hexane, and dried in vacuo to give 2.0 g of a zirconium complex. The zirconium complex was dissolved in propylene glycol monomethyl ether (PGME) and the solution was stirred for 1 hour, whereby a mixed complex solution (A-4) having a solid content concentration of 10.0% by mass was obtained.

Synthesis Example 5

4.0 g of methacrylic acid and 2.0 g of acetic acid were added to 4.0 g of the compound (M-4) and the mixture was stirred at room temperature for 72 hrs. Precipitates were confirmed to have been generated. The precipitates were washed with hexane and then dried in vacuo to give 2.0 g of a zirconium complex. The zirconium complex was dissolved in propylene glycol monomethyl ether acetate (PGMEA) and the solution was stirred for 1 hour, whereby a mixed complex solution (A-5) having a solid content concentration of 10.0% by mass was obtained.

Synthesis Example 6

35.9 g of the compound (M-5) and 1,000 g of tetrahydrofuran (THF) were mixed and stirred at 25° C. for 10 min, and then 33.4 g of hexamethylene diisocyanate was mixed thereinto, and the mixture was stirred under heating at 40° C. for 4 hrs. The resulting solution was cooled to room temperature and then 5.0 g of acetylacetone (AcAc) and 200 g of propylene glycol monoethyl ether (PGEE) were added thereto. Low-boiling substances were eliminated by using an evaporator, and the residue was diluted with PGEE to obtain a mixed complex solution (A-6) having a solid content concentration of 10.0% by mass.

Synthesis Example 7

8.0 g of tiglic acid and 5 g of hexane were added to 4.2 g of the compound (M-6) and the mixture was stirred at room temperature for 72 hrs. Precipitates were confirmed to have been generated. The precipitates were washed with hexane and then dried in vacuo to give 1.9 g of a hafnium complex. The hafnium complex was dissolved in propylene glycol monomethyl ether acetate (PGMEA) and the solution was stirred for 1 hour, whereby a mixed complex solution (A-7) having a solid content concentration of 10.0% by mass was obtained.

Synthesis Example 8

10.0 g of the compound (M-7) and 100 g of tetrahydrofuran (THF) were mixed and stirred at 25° C. for 10 min, and then 6.5 g of diethylene glycol was mixed thereinto, and the mixture was stirred under heating at 60° C. for 4 hrs. The resulting solution was then cooled to room temperature. The solvent was completely removed by using an evaporator, and non-volatile components were dried. Thereafter, ethyl lactate (FL) was added to the non-volatile components to give a mixed complex solution (A-8) having a solid content concentration of 10.0% by mass.

Synthesis Example 9

3.7 g of the compound (M-8) and 75 g of butanol (BuOH) were mixed and stirred at 25° C. for 10 min, and then 3.5 g of succinic acid was mixed thereinto, and the mixture was stirred under heating at 100° C. for 12 hrs. The resulting solution was cooled to room temperature and then 0.6 g of ethyl acetoacetate (EAcAc) was added thereto, and the solution was stirred for 10 min. Low boiling point substances were eliminated by using an evaporator to obtain a mixed complex solution (A-9) having a solid content concentration of 10.0% by mass.

Synthesis Example 10

16.2 g of the compound (M-9) and 50.0 g of ethanol were mixed and stirred at 25° C. for 10 min, and then 8.8 g of N,N'-dimethylethylenediamine was added thereto, and the mixture was stirred under heating at 50° C. for 12 hrs. The resulting solution was cooled to room temperature and then 200 g of propylene glycol monomethyl ether acetate (PG-MEA) was added thereto, and the solution was stirred for 10 min. Low boiling point substances were eliminated by using an evaporator to obtain a mixed complex solution (A-10) having a solid content concentration of 10.0% by mass.

Comparative Synthesis Example 1

10.0 g of the compound (M-1) was dissolved in 40.0 g of propylene glycol monoethyl ether (PGEE). PGEE was added to the resulting solution, whereby a solution of compound (a-1) having a solid content concentration of 10.0% by mass was obtained.

Comparative Synthesis Example 2

13.6 g of the compound (M-10) was dissolved in 40.0 g of propylene glycol monoethyl ether (PGEE), and then a mixture of 50.0 g of PGEE and 11.6 g of maleic acid was added thereto. The resulting solution was stirred for 1 hour and then PGEE was added thereto to obtain a solution of compound (a-2) having a solid content concentration of 10.0% by mass.

Preparation of Radiation-Sensitive Composition

The radiation-sensitive acid generating agent (C) which was used in the preparation of the radiation-sensitive resin compositions are shown below.

C-1: triphenylsulfonium nonafluoro-n-butanesulfonate

Preparation Example 1

The mixed complex solution (A-1) was diluted with propylene glycol monoethyl ether as a solvent, to give a solution having a solid content concentration of 5% by mass. The resulting solution was filtered through a membrane filter having a pore size of 0.20 µm, to thereby prepare a radiation-sensitive composition (R-1).

Preparation Examples 2 to 12

Radiation-sensitive compositions (R-2) to (R-12) were prepared by a similar operation to that of Preparation Example 1 except that the type and the content of each component used were as shown in Table 1. The content of the radiation-sensitive acid generating agent (C) is indicated in parts by mass with respect to 100 parts by mass of the solid content of the mixed complex. It is to be noted that the symbol "-" indicates that the corresponding component was not added.

TABLE 1

| | (M) | | (C) Radiation-sensitive acid generating agent | | |
| --- | --- | --- | --- | --- | --- |
| Radiation-sensitive composition | Mixed complex solution | Type | Content (parts by mass) | Solvent Type |
| Preparation Example 1 | R-1 | A-1 | — | — | PGEE |
| Preparation Example 2 | R-2 | A-2 | C-1 | 20 | PGME |
| Preparation Example 3 | R-3 | A-3 | — | — | EL |
| Preparation Example 4 | R-4 | A-4 | C-1 | 20 | PGME |
| Preparation Example 5 | R-5 | A-5 | — | — | PGMEA |
| Preparation Example 6 | R-6 | A-6 | — | — | PGEE |
| Preparation Example 7 | R-7 | A-7 | — | — | PGMEA |
| Preparation Example 8 | R-8 | A-8 | — | — | EL |
| Preparation Example 9 | R-9 | A-9 | — | — | BuOH |
| Preparation Example 10 | R-10 | A-10 | — | — | PGMEA |
| Preparation Example 11 | R-11 | a-1 | — | — | PGEE |
| Preparation Example 12 | R-12 | a-2 | C-1 | 20 | PGEE |

Pattern Formation

Examples 1 to 10 and Comparative Examples 1 to 2

The radiation-sensitive composition shown in the above Table 1 was spin-coated onto a silicon wafer in "CLEAN TRACK ACT-8" available from Tokyo Electron Limited, and subjected to PB at 80° C. for 60 sec to provide a film having an average thickness of 50 nm. Subsequently, the film was irradiated with an electron beam using a simplified electron beam writer ("HL800D" available from Hitachi, Ltd., power: 50 keV, current density: 5.0 ampere/cm$^2$) to permit patterning. Following the irradiation with the electron beam, a development was carried out according to a puddle procedure at 23° C. for 1 min using butyl acetate in the CLEAN TRACK ACT-8. Thereafter, the substrate was washed with pure water and then dried, whereby a pattern was formed.

Evaluations

The patterns thus formed were evaluated as described below.

Sensitivity

An exposure dose at which a line and space pattern (1L 1S) configured with a line part having a line width of 150 nm and a space part formed by neighboring line parts with an interval of 150 nm was formed to give a line width of 1:1 was defined as "optimal exposure dose", and the "optimal exposure dose" was defined as "sensitivity" (µC/cm$^2$).

Nanoedge Roughness Property

Figure 2:
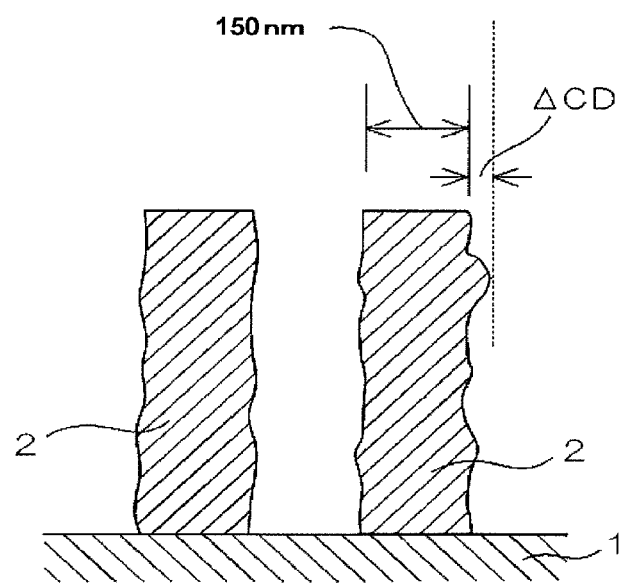
FIG. 2 shows a schematic cross sectional view illustrating a line-pattern configuration.

The line patterns of the line and space pattern (1L 1S) were observed using a scanning electron microscope for semiconductor (high-resolution FEB critical dimension measurement device "S-9220" available from Hitachi, Ltd.). Arbitrary fifty points on the pattern were observed, and with respect to the observed shape, a difference "ΔCD" between an intended line width of 150 nm and a line width in an area in which irregularities generated along the side lateral surface 2a of the line part 2 of the film formed on the silicon wafer 1 was most significant was measured as shown in FIGS. 1 and 2, by using the scanning electron microscope for semiconductor. The ΔCD value was defined as "nanoedge roughness" (nm). The nanoedge roughness property was determined to be: "AA (extremely favorable)" in the case of being no greater than 15.5 nm; "A (favorable)" in the case of being greater than 15.5 nm and no greater than 16.5 nm; and "B (unfavorable)" in the case of being greater than 16.5 nm. In the case of a failure of any pattern formation, "C" is shown in the table. It is to be noted that the irregularities shown in FIGS. 1 and 2 are exaggerated.

TABLE 2

| | Radiation-sensitive composition | Evaluations | | |
|---|---|---|---|---|
| | | Sensitivity ($\mu C/cm^2$) | Nanoedge roughness (nm) | |
| | | | Measured value (nm) | Evaluation |
| Example 1 | R-1 | 25 | 15.2 | AA |
| Example 2 | R-2 | 29 | 15.8 | A |
| Example 3 | R-3 | 10 | 15.5 | AA |
| Example 4 | R-4 | 15 | 16.2 | A |
| Example 5 | R-5 | 18 | 14.8 | AA |
| Example 6 | R-6 | 20 | 16.1 | A |
| Example 7 | R-7 | 16 | 15.2 | AA |
| Example 8 | R-8 | 22 | 15.9 | A |
| Example 9 | R-9 | 21 | 15.2 | AA |
| Example 10 | R-10 | 13 | 16.1 | A |
| Comparative Example 1 | R-11 | 50 | 14.9 | AA |
| Comparative Example 2 | R-12 | — | — | C |

From the results shown in Table 2, it was verified that the pattern-forming methods of Examples enabled improved sensitivity to be attained while maintaining the nanoedge roughness property, as compared with the pattern-forming methods of Comparative Examples.

The embodiment of the present invention enables a pattern superior in nanoedge roughness property to be formed with high sensitivity. Therefore, the pattern-forming method can be suitably used for a processing process of semiconductor devices, and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
applying a radiation-sensitive composition comprising a complex on a substrate to provide a film on the substrate;
exposing the film via a mask which has a predetermined pattern; and
developing the film exposed to form a pattern in the film, wherein the complex is a reaction product from a mixture of:
a metal-containing component that is a transition metal compound having a hydrolyzable group, a hydrolysis product of the transition metal compound having a hydrolyzable group, a hydrolytic condensation product of the transition metal compound having a hydrolyzable group, or a combination thereof, wherein the transition metal compound is represented by formula (2-1); and
an organic compound represented by formula (1):

(1)

(2-1)

wherein in the formula (1), $R^1$ represents an alkyl group, an alkanediyl group, an alkanetriyl group, or an alkanetetrayl group,
wherein the alkyl group, the alkanediyl group, the alkanetriyl group, or the alkanetetrayl group represented by $R^1$ is optionally substituted with a halogen atom, an alkoxy group, an alkoxycarbonyl group, an acyl group, a cyano group or a nitro group,
wherein:
in a case where n is 1, X represents —COOH;
in a case where n is 2 to 4, X represents —COOH, —NCO, —COOR$^A$ or —CO—C(R$^L$)$_2$—CO—R$^A$,
R$^A$ each independently representing a monovalent organic group, and
R$^L$ each independently representing a hydrogen atom or a monovalent organic group; and
in a case where n is no less than 2, a plurality of Xs are identical or different, and
wherein in the formula (2-1): M represents a transition metal atom; Y represents the hydrolyzable group selected from the group consisting of a halogen atom, an alkoxy group and a carboxylate group; and b is an integer of 2 to 6, wherein a plurality of Ys are identical or different.

2. The pattern-forming method according to claim 1, wherein the metal-containing component is a metal alkoxide that is neither hydrolyzed nor hydrolytically condensed.

3. The pattern-forming method according to claim 1, wherein in the formula (1), X represents —COOH, and n is 1.

4. The pattern-forming method according to claim 1, wherein the radiation-sensitive composition further comprises a radiation-sensitive acid generating agent.

5. The pattern-forming method according to claim 1, wherein the developing is carried out by using an alkaline solution to form a negative tone pattern.

6. The pattern-forming method according to claim 1, wherein the developing is carried out by using an organic solvent to form a negative tone pattern.

7. The pattern-forming method according to claim 1, wherein the exposing is carried out by irradiation with an extreme ultraviolet ray or an electron beam.

8. The pattern-forming method according to claim 1, wherein the transition metal compound comprises at least one transition metal selected from the groups 4 to 6 and 8 in the periodic table.

9. The pattern-forming method according to claim 1, wherein the transition metal compound comprises at least one transition metal selected from titanium, zirconium, hafnium, tantalum, tungsten and iron.

10. The pattern-forming method according to claim 1, wherein the transition metal compound comprises at least one transition metal selected from titanium, zirconium, hafnium and iron.

11. The pattern-forming method according to claim 1, wherein an amount of the organic compound with respect to 1 mol of a transition metal in the metal-containing compound is from 0.01 to 30 mol %.

12. The pattern-forming method according to claim 1, wherein an amount of the organic compound with respect to 1 mol of a transition metal in the metal-containing compound is from 0.1 to 20 mol %.

13. The pattern-forming method according to claim 1, wherein an amount of the organic compound with respect to 1 mol of a transition metal in the metal-containing compound is from 0.1 to 15 mol %.

14. The pattern-forming method according to claim 1, wherein the radiation-sensitive composition further comprises a solvent.

15. The pattern-forming method according to claim 1, wherein the radiation-sensitive composition further comprises a surfactant.

16. The pattern-forming method according to claim 1, wherein a solid content of the radiation-sensitive composition is from 0.1 to 50 mass %.

17. The pattern-forming method according to claim 1, wherein a solid content of the radiation-sensitive composition is from 0.5 to 30 mass %.

18. The pattern-forming method according to claim 1, wherein a solid content of the radiation-sensitive composition is from 1 to 20 mass %.

19. The pattern-forming method according to claim 1, wherein a solid content of the radiation-sensitive composition is from 1.5 to 10 mass %.

20. The pattern-forming method according to claim 1, wherein in the formula (1), in a case where n is 2, at least one X represents NCO, —COOR$^A$ or —CO—C(R$^L$)$_2$—CO—R$^A$.

\* \* \* \* \*